United States Patent
Inard et al.

(10) Patent No.: US 6,518,114 B2
(45) Date of Patent: Feb. 11, 2003

(54) METHOD OF FORMING AN INSULATING ZONE

(75) Inventors: Alain Inard, St. Nazaire les Eymes (FR); Dominique Cecile Zulian, Saint Martin d'Heres (FR); Didier Levy, St. Nazaire les Eymes (FR); Meindert Martin Lunenborg, Crolles (FR); Walter Jan August De Coster, St. Nazaire les Eymes (FR); Jean Claude Oberlin, Le Touvet (FR)

(73) Assignee: U.S. Philips Corporation, Eindhoven (NL)

( * ) Notice: Subject to any disclaimer, the term of this patent is extended or adjusted under 35 U.S.C. 154(b) by 0 days.

(21) Appl. No.: 09/816,485

(22) Filed: Mar. 23, 2001

(65) Prior Publication Data

US 2001/0045612 A1 Nov. 29, 2001

(30) Foreign Application Priority Data

Mar. 24, 2000 (FR) ............................................. 00 03793

(51) Int. Cl.⁷ .......................................... H01L 21/8238
(52) U.S. Cl. ......................... 438/221; 438/296; 438/359
(58) Field of Search ................................. 438/294, 295, 438/296, 297, 353, 359, 362, 221, 218, 219, 225, 424, 439, 488, 524, 589, 437, 701, 978

(56) References Cited

U.S. PATENT DOCUMENTS

| | | | |
|---|---|---|---|
| 4,389,294 A | * 6/1983 | Anantha et al. | ............. 204/192 |
| 4,970,580 A | * 11/1990 | Ishii | ............................ 357/236 |
| 5,981,356 A | 11/1999 | Hsueh et al. | ................ 438/424 |

* cited by examiner

Primary Examiner—David Nelms
Assistant Examiner—David Nhu
(74) Attorney, Agent, or Firm—Aaron Waxler

(57) ABSTRACT

The invention relates to a method of forming an insulating zone (14) around an active zone (12) in a semiconductor substrate, which method includes the following steps: forming a groove around an active zone (12) in the substrate; and filling the groove with a first material so as to form around the active zone an insulating zone (14) which projects from the surface of the substrate and forms a vertical protrusion at its periphery; and blunting the angle of the protrusion of the insulating zone at the periphery at the active zone. The invention further relates to a semiconductor device formed using said method.

6 Claims, 4 Drawing Sheets

METHOD OF FORMING AN INSULATING ZONE

FIELD OF THE INVENTION

The present invention relates in general to a method of forming an insulating zone around an active zone in a semiconductor substrate.

BACKGROUND OF THE INVENTION

The FIGS. 1A, 1B and 1C are partial sectional views that diagrammatically illustrate, by way of example, a conventional method of forming an insulating zone that bounds an active zone on which a control gate of a MOS-type transistor is be formed.

As is shown in FIG. 1A, the method starts with the formation of a groove that bounds an active zone 2 in a semiconductor substrate 1. The operation for excavating the substrate 1 so as to define the active zone 2 is performed while protecting the non-excavated parts of the substrate 1 by means of an insulating mask 3. The mask 3 is formed by a double layer which consists of a thin lower layer 3-1 that is directly in contact with the substrate and is typically made of silicon oxide ($SiO_2$); this thin layer is adjoined by a thick layer 3-2 of silicon nitride ($Si_3N_4$). The groove is filled with an insulating material, thus forming an insulating zone 4. The groove is filled in two steps: formation of a thermal oxide on the bottom and on the walls of the groove, followed by filling with silicon oxide. In order to carry out this filling operation, deposition takes place, followed by planing to the level of the upper surface of the mask 3.

During the subsequent steps, illustrated in FIG. 1B, the mask 3 is removed and several steps are executed notably for cleaning. One consequence of the removal of the mask is that the insulating zone 4 exhibits a protrusion that projects from the surface of the active zone 2, which protrusion has a substantially rectilinear and vertical profile. During the cleaning steps a depression 5 could be formed at the base of the protrusion at the periphery of the active zone 2.

The surface of the active zone is subsequently covered with a thin insulating layer 6. At this stage generally sequences of steps for doping the active zone 2 by implantation/diffusion are generally carried out. Such operations are ignored herein, because they have no bearing whatsoever on the problems to be described hereinafter. The layer 6 is intended, for example to form the gate insulator of a MOS transistor. After the formation of this gate insulator 6, a layer 7 of a conductive material, generally being polycrystalline silicon, is deposited. In order to define a gate having a transistor-type structure, in the example illustrated herein a thick layer 8 of an anti-reflective coating material is deposited (this layer is generally referred to by the acronym Barc (Bottom Anti-Reflective Coating)), followed by the deposition of a mask of resin that defines the pattern of the gate to be formed (another procedure would be to deposit the resin mask first and then the anti-reflective material). The resin layer is not shown in FIG. 1B, because it is assumed that the sectional view is taken in a region of the active zone 2 where the gate does not extend. It is known to use typically a layer 8 of an organic type that enables suitable planing of the structure and that can also be readily removed. However, the etching selectivity for the layer 8 with respect to the superposed resin is low.

During the subsequent steps (illustrated in FIG. 1C), the conventional etching steps are performed so as to remove the layer 7 beyond the gate regions and other regions where conductive structures are to be formed.

A drawback of this type of method resides in the fact that, as is shown in FIG. 1C, after the steps for removing the layer 7 the structure is often polluted by residues of this layer. More specifically, residue 7-1 is liable to be left behind on the insulator 6, approximately at the center of the active zone 7, as well as residue 7-2 along the protrusion of the insulating zone 4.

As is shown in the diagrammatic partial plan view of FIG. 2, when forming continuous tracks the residues 7-1 and 7-2 cause short circuiting of conductive structures formed on the active zone 2 bounded by the insulating zone 4. For example, the conductive residues 7-1, 7-2 will cause the short circuiting of three conductive lines L1, L2 and L3 that traverse the active zone 2 and are insulated therefrom by an insulating layer.

In the case of control gates of transistors such short circuiting causes malfunctioning of the device in which they are included. Therefore, in the case of memory matrices of the dynamic random access type (DRAM) such switching may cause involuntary storage or erasure of data.

SUMMARY OF THE INVENTION

Therefore, it is an object of the present invention to propose a novel method of manufacture which enables elimination of the formation of parasitic residues during the etching of the conductive gate layer.

In order to achieve this object, the present invention provides a method of forming an insulating zone around an active zone in a semiconductor substrate, which method includes the following steps:

forming a groove around an active zone in said substrate;

filling the groove with a first material so as to form around the active zone, an insulating zone which projects from the surface of the substrate and forms a vertical protrusion at its periphery, and blunting the angle of the protrusion of the insulating zone at the periphery of the active zone.

In one version of the method in accordance with the present invention the step a) for forming the groove is carried out by means of a mask that consists of at least a second material.

In a further version of the method in accordance with the present invention the step c) for blunting said angle includes the following steps:

etching said mask in such a manner that only a reduced thickness remains, and carrying out a bombardment by means of particles.

In a further version of the method in accordance with the present invention the step c) for blunting said angle consists in performing simultaneous etching of the first and the second material, which etching has a selectivity ratio greater than one between the second and the first material.

According to a further version of the method in accordance with the present invention the step c) for blunting said angle consists of the sequential etching of small thicknesses of the first and the second material in order to eliminate the second material completely and to impart to said protrusion an angle of the order of 135 degrees relative to the surface of the substrate.

In another version of the method in accordance with the present invention the first material is silicon oxide ($SiO_2$) and the second material is silicon nitride ($Si_3N_4$).

In a further version of the method in accordance with the present invention the particles are argon atoms.

In a further version of the method in accordance with the present invention said etching is performed by means of a mixture of hydrofluoric acid (HF) and ethylene glycol (CH$_2$OH—CH$_2$OH).

In another version of the method in accordance with the present invention a solution of hydrofluoric acid (HF) and a solution of phosphorous acid (H$_3$PO$_4$) are used in succession for etching the first material and for etching the second material, respectively.

BRIEF DESCRIPTION OF THE DRAWING

These and other objects, characteristics and advantages of the present invention will be described in detail hereinafter on the basis of specific versions, given by way of non-limitative example, and with reference to the accompanying Figures; therein.

DETAILED DESCRIPTION OF THE PRIMARY EMBODIMENT

For the sake of clarity corresponding elements are denoted by corresponding references in the various Figures and, as is common practice in the representation of integrated circuits, the various Figures are not drawn to scale.

Figure 1A:
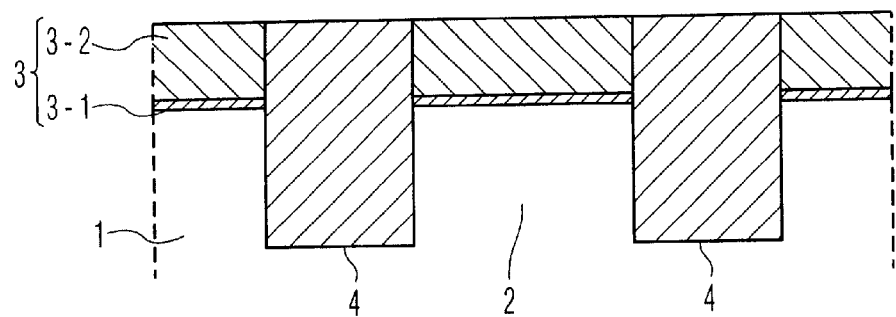
FIGS. 1A to 1C illustrate, in the form of sectional views, a conventional method of forming an insulating zone.
Figure 1B:
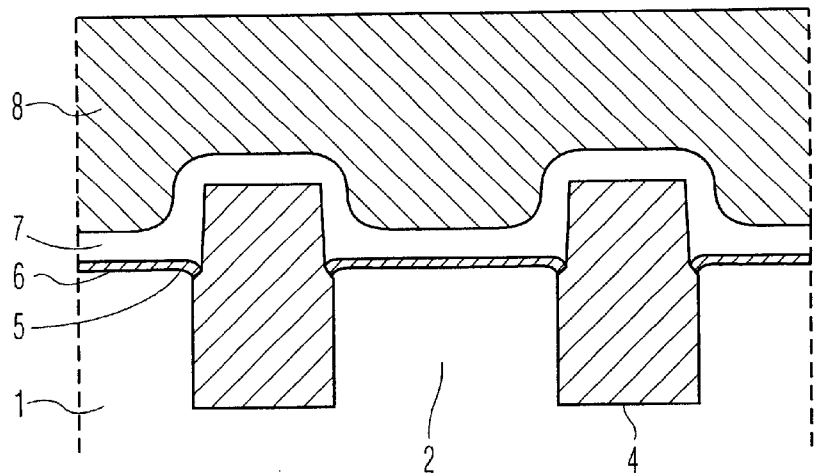
Figure 1C:
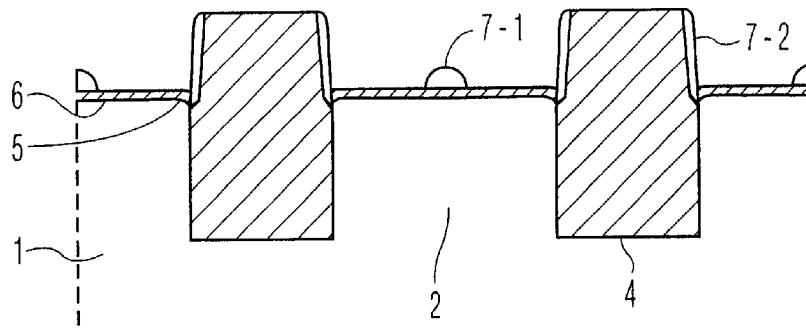
Figure 2:
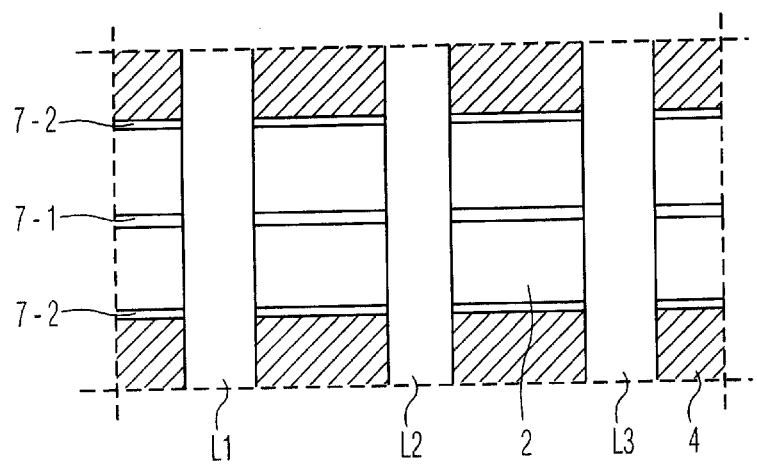
FIG. 2 is a plan view of the structure of FIG. 1C.

The present invention takes advantage of the research performed by the present inventors concerning the origins of the etching residues 7-1 and 7-2 (FIG. 1C) of the conductive gate layer 7 (FIG. 1B). The inventors have come to the conclusion that such residues have a common origin in the substantially vertical topology of the protrusion of the insulating zone 4 that projects from the surface of the active zone 2.

This substantially vertical topology complicates the etching of the various materials. Indeed, the width of the opening formed during the definition of gates of transistors is reduced with respect to the height of the protrusion of the neighboring insulating zone, and the thick planing deposit of the insulating material 8 (FIG. 1B) causes a very significant local excess thickness perpendicularly to the active zone. Therefore, it is a complex operation to remove completely the bottom of the opening formed so as to define the gates of transistors. This results in the formation of residues 7-1.

Moreover, the abrupt and large step between the upper surface of the active zone 2 and the upper surface of the insulating zone 4 favors the formation of peripheral residues 7-2 of the spacer type, that is, at the periphery of the active zone 12, and bearing against the protrusion of the insulating zone, during the etching of the conductive material that is intended to form the gates.

In order to avoid the formation of such residues, the present invention proposes to blunt the vertical profile of the protrusion of the insulating zone by blunting its angle.

The FIGS. 3A to 3E illustrate a first method of forming an insulating zone having a non-vertical protrusion in conformity with the present invention. More specifically, the FIGS. 3A to 3E illustrate, that is, in a partial sectional and diagrammatic view, the state of a semiconductor substrate 10 in various stages of a method in accordance with the present invention for the formation of an insulating zone around an active zone.

Figure 3A:
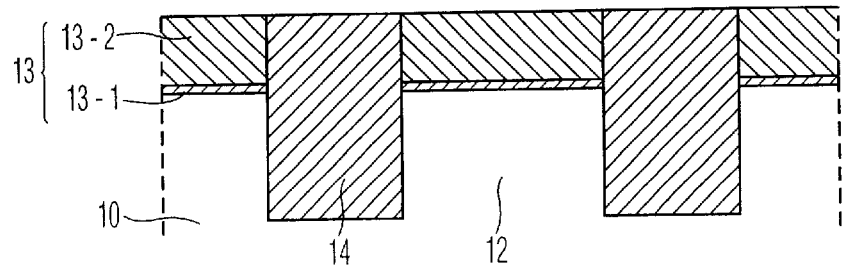
FIGS. 3A to 3E illustrate a first version of the method in accordance with the present invention.

In FIG. 3A the method in accordance with the invention commences with a sequence of conventional steps that consists of, for example, defining an active zone 12 in the substrate 10 by forming a groove in the substrate 10 by means of a mask 13 and by filling the groove so as to form an insulating zone 14. The mask 13 may consist of two superposed layers: a thin lower layer 13-1 which is directly in contact with the substrate 10 and an upper layer 13-2. The two layers 13-1 and 13-2 are made of materials that can be selectively etched relative to one another. The layer 13-1 is made of a material that can be selectively etched relative to the substrate 10. The layer 13-2 is selectively etchable with respect to the material constituting the insulating zone 14. These layers will be, for example a layer 13-1 of silicon oxide of a thickness of between 5 and 20 nm, typically of the order of 7 nm, and a layer of silicon nitride of a thickness of between 100 and 200 nm, for example, 160 nm. It is to be noted that the mask 13 may be formed by a single layer 13-2 that can be selectively etched relative to the material constituting the insulating zone 14. The groove can be filled with any suitable means. Filling will involve, for example, growing a layer of thermal oxide on the bottom and the walls of the groove, followed by deposition of silicon oxide in the groove up to the upper level of the mask 13 and subsequent planing while stopping at the level of the surface of the mask 13.

Figure 3B:
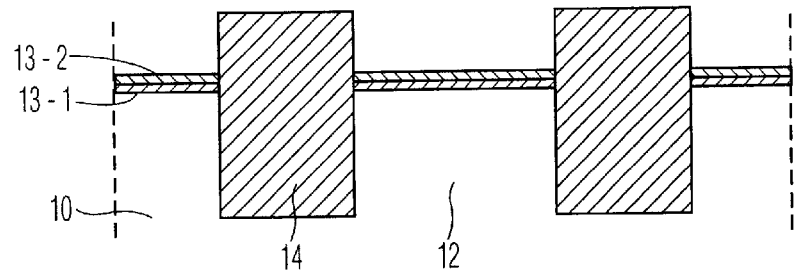

During the next step (shown in FIG. 3B) of a first version of the present invention the upper layer 13-2 of the mask 13 is partly etched. This removal of the masking layer 13-2 takes place over a comparatively large thickness as will be defined hereinafter. As is shown in FIG. 3B, the protrusion of the insulating zone 14 then projects from the surface of the mask 13.

Figure 3C:
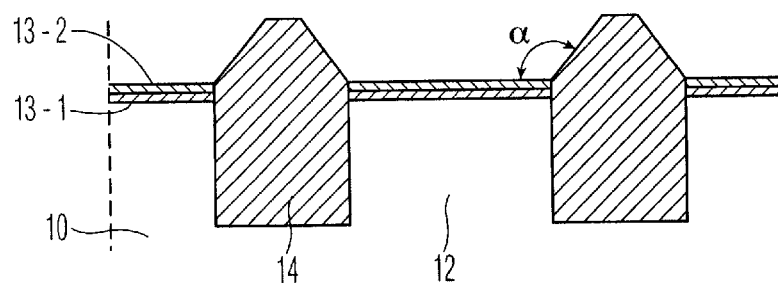

During the next step, illustrated in FIG. 3C, the structure is bombarded by means of particles that are suitable for blunting the angle of the insulating zone 14 between its protrusion and its upper surface. The thickness retained for the layer 13-2 is chosen so as to realize a suitable compromise between the following conditions. On the one hand, the layer 13-2 should remain sufficiently thick so as to ensure the protection of the underlying structure against bombardment particles. On the other hand, the thickness of the layer 13-2 must be minimized so as to maximize the exposed, and hence bombarded, part of the protrusion of the insulating zone 14. These two conditions can be comparatively easily satisfied, because the effect of a bombardment on a plane surface is far less than that on a surface situated in a vertical plane. In other words, the impact effect on the zone 14 is far greater than that on the layer 13-2.

More specifically, if the insulating zone 14 consists of silicon oxide, the bombardment particles are preferably argon atoms and the angle of the insulating zone 14 is blunted to 45 degrees. In other words, the angle α between the protrusion of the insulating zone 14 and the upper surface of the mask 13 will be of the order of 135 degrees instead of the 90 degrees in conformity with prior art. The topology before etching, therefore, is much more open than in prior art and the deposition of the layer 17 causes less excess thickness at the periphery of the active zone. If the bombardment particles are argon and the layer 13-2 is made of silicon nitride, the latter will be partly eliminated so as to leave a thickness of the order of 20 nm, the bombardment in that case using up a thickness of the silicon nitride of the order of from 10 to 15 nm.

Figure 3D:
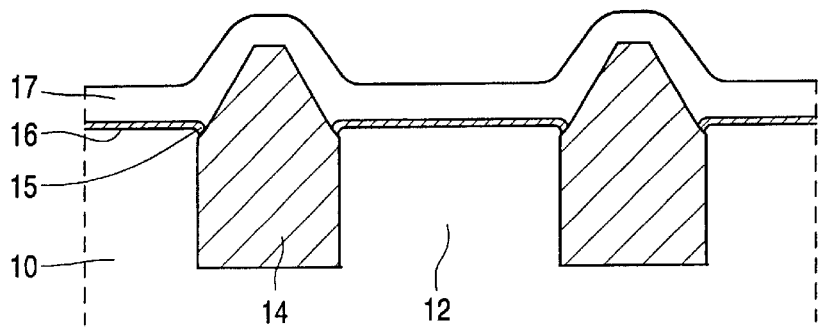

As is shown in FIG. 3D, the method then continues with a sequence of steps which includes, for example, the following steps: elimination of the remaining mask 13;

cleaning, while etching the insulating zone 14, perhaps causing the formation of a depression 15 at the periphery of the active zone 12; formation of a gate insulator 16 by thermal silicon oxide, and deposition of a conductive gate material 17. The material 17 is deposited in conformity therewith. It is, for example, a layer of polycrystalline silicon of a thickness of from 180 to 250 nm.

It is to be noted that the formation of the gate insulator 16 may be preceded by various operations, notably for the doping of the active zone 12. Those skilled in the art will understand that only the steps necessary for understanding the principles of the invention are taken up in the present description, however, without limiting the feasible applications in any way.

Figure 3E:
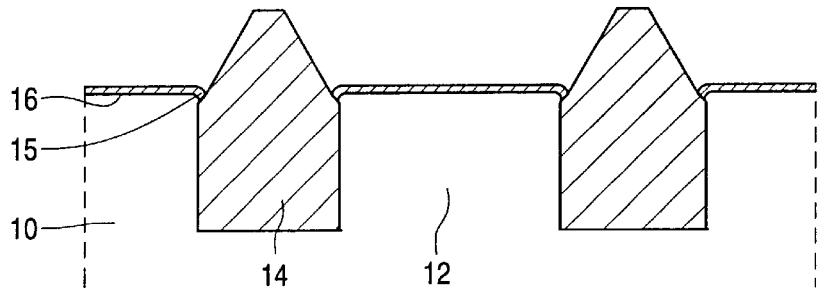

During the next steps, illustrated in FIG. 3E, the operations for depositing the etching mask for gate structures of the transistors are performed (planing coating, resin), followed by etching as described above with reference to the FIGS. 1B and 1C. Because of the more open topology of the structure in accordance with the invention, resulting from the blunting of the angle of the insulating zone 14, the excess thickness of the planing coating will be less. Therefore, it is more readily eliminated at the center of the structure (elimination of the residues 7-1, FIG. 1C). Moreover, the excess thickness at the periphery of the active zone of the layer 17 is reduced in comparison with a conventional method. This enables its complete etching at areas where it is not intended to remain and no residue of the spacer type is formed (7-2, FIG. 1C). Consequently, the structure is void of any residue of the conductive material 17 and the object of the present invention is perfectly achieved by this first version of the method.

Figure 4A:
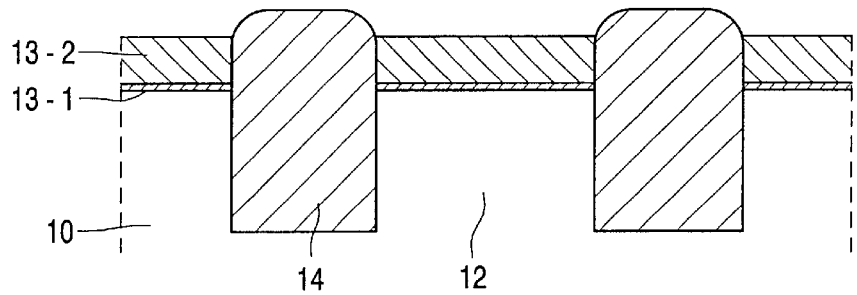
FIGS. 4A to 4C illustrate a second version of the method in accordance with the present invention.
Figure 4B:
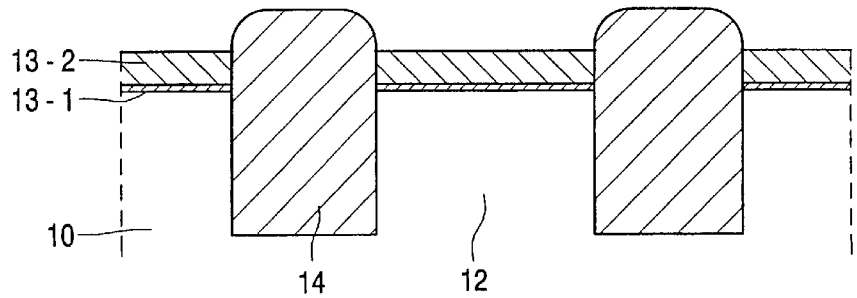
Figure 4C:
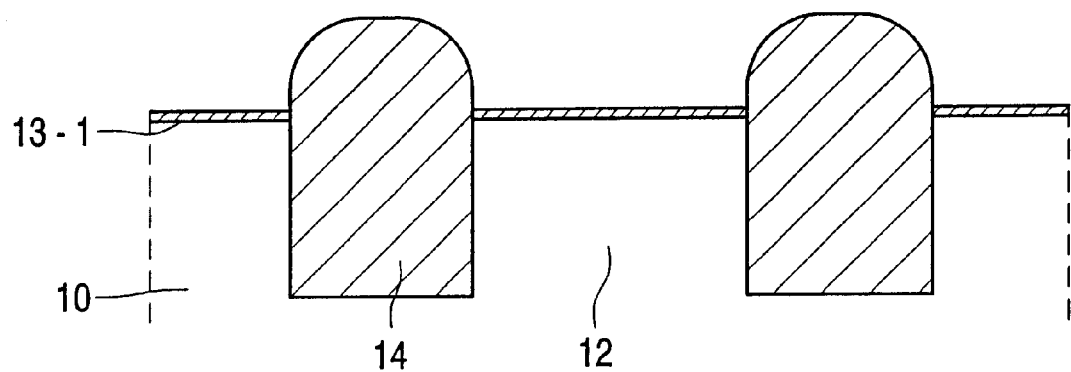

The FIGS. 4A to 4C illustrate, in a diagrammatic and partial sectional view, a second version of the method of carrying out the present invention. This version commences with the steps previously described with reference to the FIGS. 1A and 3A.

During the next step, illustrated in FIG. 4A, the materials constituting the upper layer 13-2 of the mask 13 and the insulating zone 14, respectively, are etched simultaneously. In conformity with the present invention, said etching is performed by means of an agent, for example a solution, presenting a selectivity ratio larger than 1 between the material constituting the layer 13-2 and the material constituting the insulating zone 14. Referring to the above example again and assuming that the layer 13-2 is made of silicon nitride and that the insulating zone 14 is made of silicon oxide, the foregoing implies the use of an agent such that the speed of etching of the silicon nitride is higher than that of the etching of the silicon oxide, Preferably, such an agent will be chosen that the ratio of the etching speeds of the silicon nitride and the silicon oxide is of the order of 1.2. For example, it will be a solution of hydrofluoric acid (HF) and ethylene glycol (ethane diol-1,2, $CH_2OH—CH_2OH$). As is illustrated in the FIGS. 4B and 4C, such etching is continued until the layer 13-2 has been completely eliminated.

FIG. 4B illustrates an intermediate state in which substantially half (50%) of the material constituting the layer 13-2 has been removed whereas the material constituting the insulating zone 14 has only been partly eliminated.

The use of an agent having a selectivity greater than 1 on the one hand causes the material of the layer 13-2 to be removed more than the material of the zone 14 and on the other hand rounds the angle of the protrusion of the insulating zone 14. FIG. 4C illustrates the result of the etching operation. The insulating layer 13-2 has been completely eliminated and the angle of the protrusion of the insulating zone 14 has been blunted so that the insulating zone 14 now has a "dome-shaped" profile.

This second version of the method in accordance with the invention also enables a topology to be obtained that is less abrupt than that of the prior art. As for the first version, during the later etching operations the material of the anti-reflective coating and the material of the gate (polycrystalline silicon) can be completely eliminated at the appropriate areas. Therefore, there will be no more residues so that the quality of the structures formed is enhanced.

Figure 5:
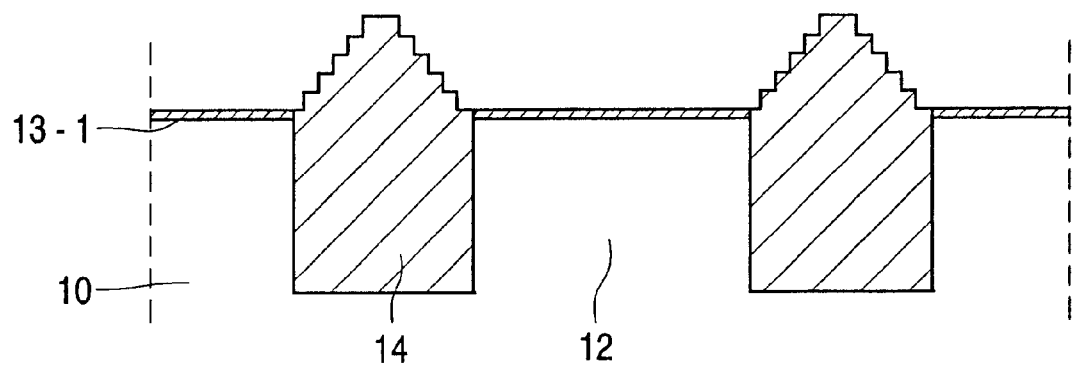
FIG. 5 illustrates a third version of the method in accordance with the present invention.

FIG. 5 illustrates a third version of the present invention in a diagrammatic partial sectional view. FIG. 5 corresponds to the FIGS. 3D/4C. In conformity with this version, the preliminary steps described above with reference to FIG. 3A are succeeded by a number of successive etching operations performed on parts of the material constituting the layer 13-2 and on parts of the material constituting the insulating zone 14. As a result, the top of the insulating zone 14 is formed as a stepped protrusion.

In order to achieve this, different etching agents that are suitable for etching the material of the layer 13-2 and the material constituting the insulating zone 14, respectively, are used in an alternating fashion (until complete elimination of the layer 13-2). For example, if these materials are silicon nitride and silicon oxide, respectively, first a fraction of the silicon nitride constituting the layer 13-2 is etched away by means of phosphorous acid ($H_3PO_4$). Subsequently, a fraction of the silicon oxide constituting the insulating zone 14 is etched away by means of hydrofluoric acid (HF), and so on. When the etching operations are repeated in rapid succession, the stepped appearance of the protrusion of the insulating zone will be smoothed.

According to this third version of the method it is advantageous to stop the etching of the insulating zone 14 when the layer 13-2 has been completely eliminated; this is done so as to avoid the risk of contamination of the surface of the active zone 12 by deterioration of the thin layer 13-1.

It is to be understood that the present invention is subject to various alternatives and modifications that will be evident to those skilled in the art.

More specifically, those skilled in the art will be able to adapt the various processes for blunting the angle of the insulating zone 14 as described above to the constituent material. Notably in the case of the second version those skilled in the art will be able to adapt the agent for the simultaneous etching to the materials that are selectively etchable relative to one another and constitute the upper layer 13-2 of the mask 13 and the insulating zone 14, respectively. Moreover, the selectivity ratio can be adjusted as a function of the angle desired for the protrusion of the insulating zone 14.

Moreover, the method of the invention has been described as applied for the formation of the gate of a transistor of the MOS type. However, those skilled in the art will note that on the basis of the same principles it will be possible to provide a semiconductor substrate with any insulating zone surrounding an active zone in which an integrated device must be formed. Those skilled in the art will also be able to adapt the characteristics (material, thickness, mode of formation) of the various layers described to a specific production die.

What is claimed is:

1. A method of forming an insulating zone around an active zone in a semiconductor substrate, which method includes the following steps:

forming a groove around an active zone in said substrate;

filling the groove with a first material so as to form around the active zone an insulating zone which projects from a surface of the substrate and forms a vertical protrusion at its periphery; and blunting an angle of the protrusion of the insulating zone at the periphery at the active zone, wherein a step for forming the groove is carried out by means of a mask that consists of at least a second material, wherein a step for blunting said angle includes the following steps:

etching said mask (13) in such a manner that only a reduced thickness remains, and carrying out a bombardment by means of particles.

2. A method of forming an insulating zone around an active zone in a semiconductor substrate, which method includes the following steps:

forming a groove around an active zone in said substrate;

filling the groove with a first material so as to form around the active zone an insulating zone which projects from a surface of the substrate and forms a vertical protrusion at its periphery; and blunting an angle of the protrusion of the insulating zone at the periphery at the active zone, wherein a step for forming the groove is carried out by means of a mask that consists of at least a second material, wherein a step for blunting said angle consists in performing simultaneous etching of the first and the second material, which etching has a selectivity ratio greater than one between the second and the first material.

3. A method of forming an insulating zone around an active zone in a semiconductor substrate, which method includes the following steps:

forming a groove around an active zone in said substrate;

filling the groove with a first material so as to form around the active zone an insulating zone which projects from a surface of the substrate and forms a vertical protrusion at its periphery; and blunting an angle of the protrusion of the insulating zone at the periphery at the active zone, wherein a step for forming the groove is carried out by means of a mask that consists of at least a second material, wherein a step for blunting said angle consists of the sequential etching of small thickness of the first and the second material in order to eliminate the second material (13-2) completely and to impart to said protrusion an angle of the order of 135 degrees relative to the surface (10).

4. A method as claimed in claim 1, wherein the particles are argon atoms.

5. A method as claimed in claim 2, wherein said etching is performed by means of a mixture of hydrofluoric acid (HF) and ethylene glycol ($CH_2OH$—$CH_2OH$).

6. A method as claimed in claim 3, wherein a solution of hydrofluoric acid (HF) and a solution of phosphorous acid ($H_3PO_4$) are used in succession for etching the first material and for etching the second material (13-2), respectively.

* * * * *